(12) United States Patent
Noel et al.

(10) Patent No.: US 7,432,729 B2
(45) Date of Patent: Oct. 7, 2008

(54) METHODS OF TESTING ELECTRONIC DEVICES

(75) Inventors: Michael A. Noel, Austin, TX (US); Douglas R. Grover, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 159 days.

(21) Appl. No.: 11/328,645

(22) Filed: Jan. 10, 2006

(65) Prior Publication Data
US 2007/0159202 A1    Jul. 12, 2007

(51) Int. Cl.
*G01R 31/02*    (2006.01)
(52) U.S. Cl. ..................................... 324/760
(58) Field of Classification Search .................. None
See application file for complete search history.

(56) References Cited

U.S. PATENT DOCUMENTS

| | | | | |
|---|---|---|---|---|
| 5,821,505 A | * | 10/1998 | Tustaniwskyj et al. | 324/760 |
| 5,844,208 A | * | 12/1998 | Tustaniwskyj et al. | 324/760 |
| 5,918,665 A | * | 7/1999 | Babcock et al. | 257/715 |
| 6,636,063 B2 | * | 10/2003 | Arnold et al. | 324/762 |
| 6,650,132 B2 | | 11/2003 | Pelissier | |
| 6,788,084 B2 | * | 9/2004 | Jones et al. | 324/760 |
| 6,825,681 B2 | | 11/2004 | Feder | |
| 6,879,172 B1 | * | 4/2005 | Eppes et al. | 324/760 |
| 6,886,976 B2 | * | 5/2005 | Gaasch et al. | 324/760 |
| 6,900,650 B1 | * | 5/2005 | Sheng et al. | 324/760 |
| 2004/0204899 A1 | * | 10/2004 | Gunther et al. | 702/132 |
| 2005/0007136 A1 | | 1/2005 | Feder | |
| 2005/0036352 A1 | | 2/2005 | Norris | |
| 2005/0067146 A1 | * | 3/2005 | Thayer et al. | 165/80.3 |
| 2006/0290366 A1 | * | 12/2006 | Kon et al. | 324/760 |
| 2007/0108388 A1 | * | 5/2007 | Lane et al. | 250/353 |
| 2007/0138395 A1 | * | 6/2007 | Lane et al. | 250/353 |

* cited by examiner

Primary Examiner—Jermele M Hollington

(57) ABSTRACT

A method and system of testing an electronic device can be performed by estimating the die temperature using correlation data previously collected for other electronic devices. In one embodiment, correlation data can include (1) die temperatures measured and (2) currents drawn by the electronic devices, testing voltages for the electronic devices, or powers consumed by the electronic devices during the testing. The correlation data can be used to generate an equation or be stored in a table. A method of testing a subsequent electronic device can include testing the subsequent electronic device. The method can also include estimating a die temperature for the subsequent electronic device during testing, wherein the die temperature can be estimated at least in part using a current drawn by the subsequent electronic device, a testing voltage for the subsequent electronic device, or a power consumed by the subsequent electronic device.

18 Claims, 3 Drawing Sheets

METHODS OF TESTING ELECTRONIC DEVICES

BACKGROUND

1. Field of the Disclosure

The present disclosure relates to electronic devices, and more particularly to methods of testing electronic devices.

2. Description of the Related Art

Burn-in and other types of electrical testing are typically performed on electronic devices, such as integrated circuits, before the electronic devices are shipped to customers. FIG. 1 includes an illustration of a cross-section of an electronic device 10, which includes a die 12 that has one or more circuits, electronic components, or any combination thereof (not illustrated). The die 12 is attached to a substrate 14 and is encapsulated by a case 16. The case 16 can include a ceramic material, an organic material, or other suitable material used for encapsulating the die 12. The electronic device 10 also includes electrical connectors 18 that allow signals to be transmitted from outside the electronic device 10 to the die 12. Although not illustrated, traces are embedded within the packaging substrate 14 to allow signals to pass from the electrical connectors 18 to the die 12. The electrical connectors 18 can include solder balls, pins, or other suitable terminals used to connect the electronic device 10 to an external power source, one or more other signal lines, or any combination thereof.

During burn-in or other testing of the electronic device 10, heat can be generated by the die 12. A temperature of the die (herein, "die temperature") or the case (herein, "case temperature") may be used to control the temperature of the electronic device 10 during burn-in or other testing. The die temperature can be determined by using a conventional or proprietary thermal diode or thermal resistor within the die 12. If the die temperature is to control the temperature, additional complexity may involve obtaining signals related to the thermal diode or resistor.

Alternatively, the case temperature is typically used because it is significantly simpler than measuring the die temperature. For example, a conventional or proprietary optical or thermal sensor can sense the case temperature. The case temperature can be measured at or near an exposed outer surface of the case, and can be monitored on a device-by-device basis. An external heating source may be used to adjust the case temperature to be within a specified range. For example, the case temperature may be set to 125° C.+/−0.5° C.

The case temperature is not an accurate predictor of the die temperature because different electronic devices may draw different currents. For example, the die temperature may vary by 20° or more between electronic devices even though the case temperatures for those electronic devices are maintained close to 125°. The difference in die temperature can significantly affect the time needed to properly burn-in the electronic device 10. Thus, skilled artisans are faced with a dilemma of using a more complicated testing set-up or procedure when measuring die temperature or use a relatively simpler but more inaccurate testing environment when the case temperature is used.

BRIEF DESCRIPTION OF THE DRAWINGS

The invention is illustrated by way of example and not limitation in the accompanying figures.

Figure 1:
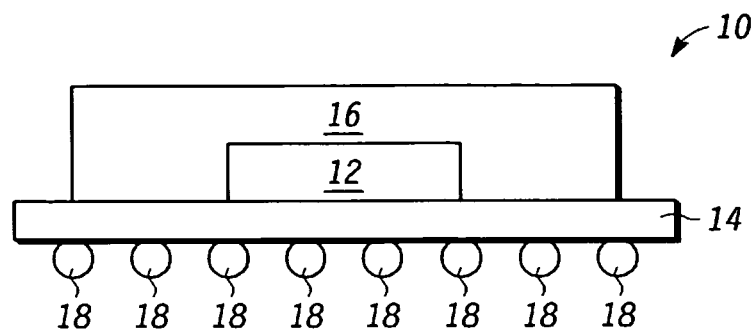
FIG. 1 includes an illustration of a cross-sectional view of an electronic device (prior art).

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

A method and system of testing an electronic device can be performed by estimating the die temperature using correlation data previously collected for other electronic devices. In one embodiment, correlation data can be collected for electronic devices that belong to the same electronic device family. Each electronic device includes a die and a case. The correlation data can include (1) die temperatures measured and (2) currents drawn by the electronic devices, testing voltages for the electronic devices, or powers consumed by the electronic devices during the testing. The correlation may include other data, such as case temperatures, power or other signals provided to the external heating/cooling sources, etc. The correlation data can be used to generate an equation or be stored in a table. A table may correspond to a single electronic device family, a thermal resistance characteristic of a case for the electronic device, etc. The method of testing a subsequent electronic device can include testing the subsequent electronic device using a set of conditions. The method can also include estimating a die temperature for the subsequent electronic device during testing using the set of conditions, wherein the die temperature can be determined at least in part using a current drawn by the subsequent electronic device, testing voltage for the subsequent electronic device, or a power consumed by the subsequent electronic device. In a particular embodiment, the current drawn by the electronic device, the case temperature, and the thermal resistance of the case may be used in an equation to determine an estimated die temperature. In other embodiments, other variables or constants may be used instead of or in addition to current, case temperature, and thermal resistance.

Before addressing details of embodiments described below, some terms are defined or clarified. The term "electronic device family" is intended to mean that substantially all of the electronic devices within a set of electronic devices can be fabricated using a majority of the same masks or other lithographic patterns and have the same type of case (e.g., plastic, ceramic, etc.). In one embodiment, such a family of electronic device can include the same mask set other than at one or more metal, wiring, or interconnect levels. Thus, the same masks can be used for forming electronic components, such as transistors, capacitors, resistors, etc. for the electronic device; however, the connection of the electronic components may allow for "metal mask" options. For example, a memory integrated circuit may have a billion memory cells that may be have a 1 Mbit×1 configuration, a 256 Kbit×4 configuration, or a 128 Kbit×8 configuration. Each of the memory integrated circuits may use the same type of case (e.g., a plastic ball grid array). Thus, memory integrated circuits with the different configurations but using the same type of case can belong to the same electronic device family.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the terms "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless stated otherwise, systems or portions thereof may be bi-directionally or uni-directionally coupled to each other. Coupling should be construed to include direct electrical connections and any one or more of intervening switches, resistors, capacitors, inductors, and the like between any two or more components.

Unless otherwise defined, all technical and scientific terms used herein have the same meaning as commonly understood by one of ordinary skill in the art to which this invention belongs. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following detailed description, and from the claims.

To the extent not described herein, many details regarding specific materials, processing acts, and circuits are conventional and may be found in textbooks and other sources within the semiconductor and microelectronic arts.

Figure 2:
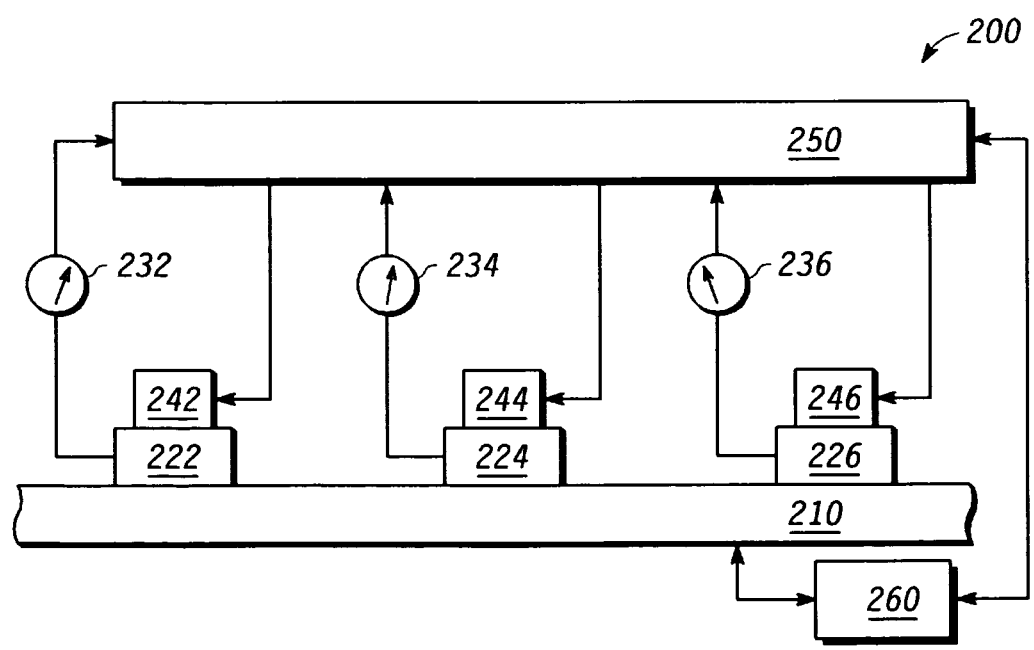
FIG. 2 includes a schematic diagram of a system that can be used in performing burn-in or other testing of electronic devices.
Figure 3:
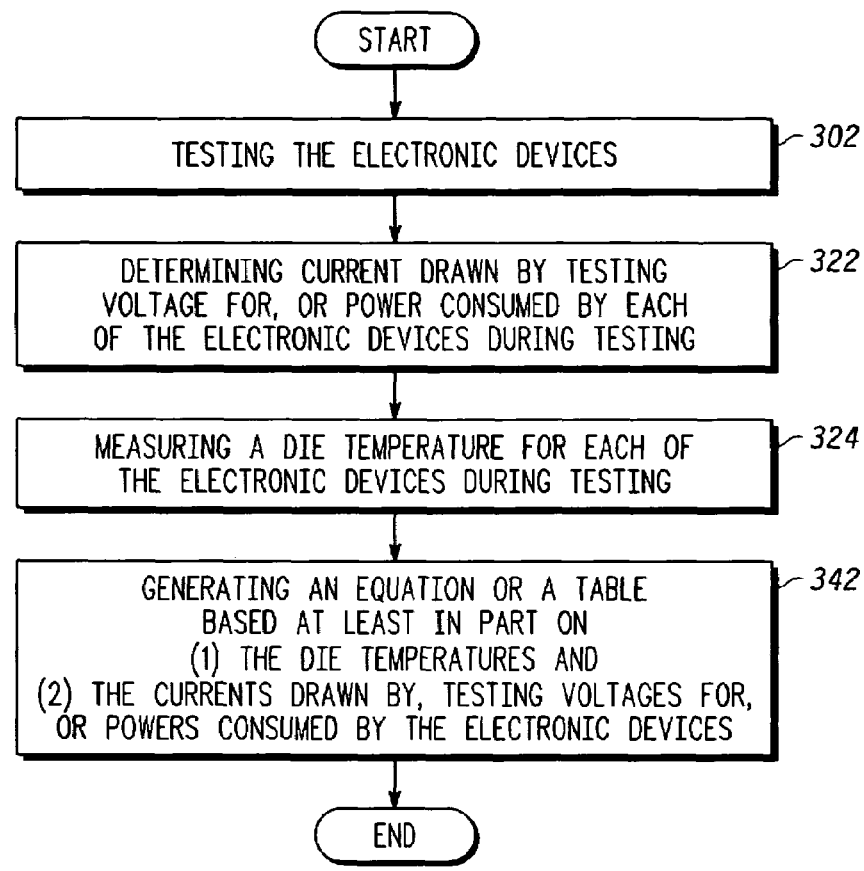
FIG. 3 includes a flow chart of method used to collect die temperature and electronic parameters of a first set of electronic devices that can be used as correlation data.
Figure 4:
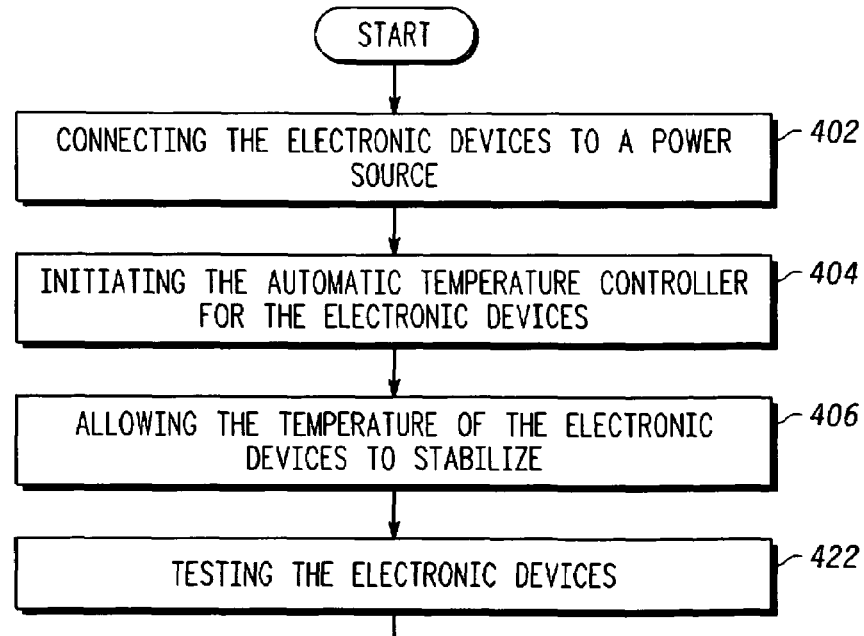
FIGS. 4 and 5 include a flow chart of method used during testing of a second set of electronic devices, wherein die temperatures can be determined using the correlation data.
Figure 5:
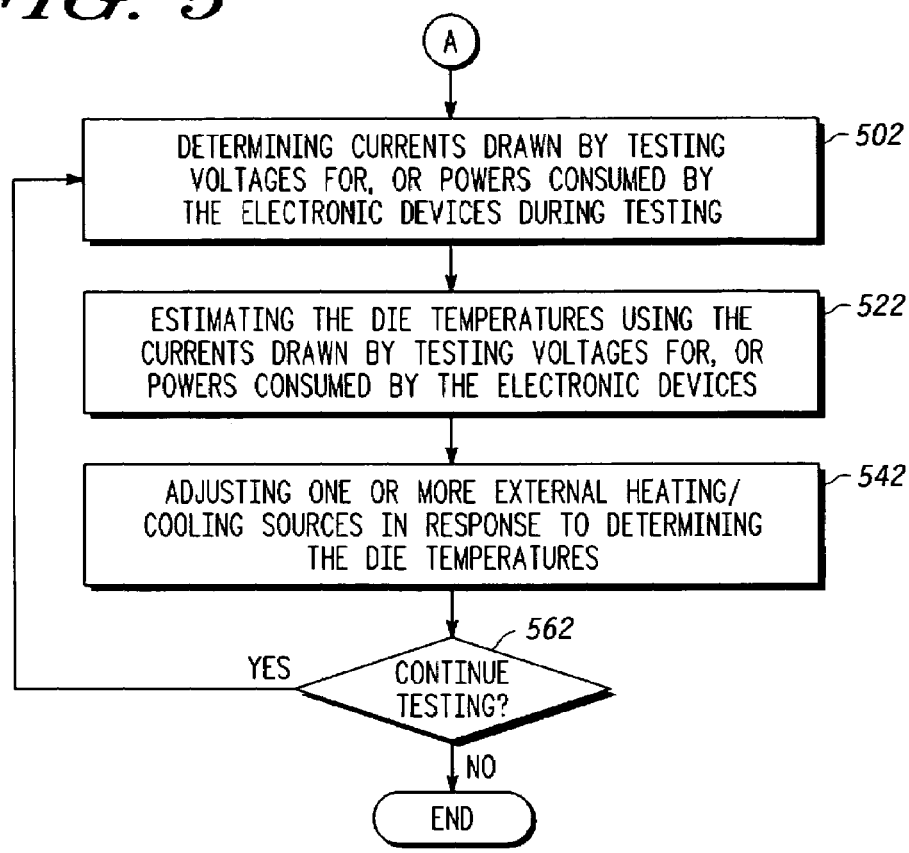

A brief overview of FIGS. 2 through 5 is given before describing each of the figures in detail. FIG. 2 includes a system that can be used for burning-in or otherwise testing electronic devices. FIG. 3 includes flow chart for a method that can include collecting die temperature measurements and electrical data for a set of electronic devices during burn-in or other testing. Such data can be used as correlation data. FIGS. 4 and 5 include a flow chart for a method can be used in estimating die temperatures for another set of electronic devices during burn-in or other testing, wherein the die temperatures can be determined, at least in part, using the correlation data as described with respect to FIG. 3.

Before describing the methods in detail, an exemplary, non-limiting system that can be used with the methods is described and illustrated in FIG. 2. FIG. 2 includes an illustration of a schematic diagram of a testing system 200. In the testing system 200, electronic devices 222, 224, and 226 are mounted onto or otherwise attached to a testing board 210. The testing board 210 may or may not have sockets for receiving the electronic devices. The electronic devices 222, 224, and 226 can belong to the same electronic device family, and in a particular embodiment, can be substantially identical to one another.

The system 200 can further include a measuring device 232 that is coupled to the electronic device 222. In one embodiment, the measuring device 232 can measure a current drawn by the electronic device 222, a testing voltage for the electronic device 222, or both. The product of the current and voltage can be used as a power consumed by the electronic device 222. Regarding the testing voltage for the electronic device 222, such voltage can be a voltage difference for terminals of one or more external power sources connected to the electronic device 222. For example, the power source may have one terminal at substantially zero volts and another terminal at approximately 1.8 volts. In this embodiment, the testing voltage for the electronic device 222 can be 1.8 volts. In another embodiment, one or more different voltages can be used. For example, one of the terminals may have a voltage higher or lower than 1.8 volts. Additionally, one or more of the power supply terminals can have a negative value. The difference in voltage between the terminals is more important than the actual voltage of those terminals. In one particular embodiment, testing voltage may be held substantially constant, and current can be measured to determine the power consumed by the electronic device. The testing voltage may or may not be the same voltage as used when normally operating the electronic device (as used by an end-user of the electronic, not during testing). The case temperature may also be measured. A conventional or proprietary temperature measuring device (not illustrated) can be used.

The measuring device 232, the temperature measuring device, another suitable measuring device, or any combination thereof is coupled to an automatic temperature controller 250. The readings from one or more of the measuring devices can be sent to the temperature controller 250. The temperature controller 250 can be bi-directionally coupled to a testing system controller 260. The testing system controller 260 can receive a signal from the temperature controller 250 corresponding to the reading from one or more of the measuring devices, and send another signal back to the temperature controller 250 in order for the temperature controller 250 to control to an external heating/cooling source 242 that is adjacent to the electronic device 222. The testing system controller 260 may have a primary function of determining the set of conditions or other parameters to be used during testing of the electronic devices 222, 224, and 226, provide signals to the electronic devices 222, 224, and 226 during testing, provide one or more other suitable functions during burn-in or other testing, or any combination thereof.

One or more of the functions of the automatic temperature controller 250 and the testing system controller 260 may be swapped. For example, the temperature controller 250 may process the information from the measuring device 232, without using the testing system controller 260, in order to provide the proper signal to the external heating/cooling source 242. In another embodiment, the functions of the temperature controller 250 may be incorporated into the testing system controller 260. In still another embodiment (not illustrated), readings from one or more of the measuring devices may be provided to the testing system controller 260, which in turn may forward such reading to the temperature controller 250. After reading this specification, skilled artisans will be able to configure the system 200 to meet their needs or desires.

In one embodiment, the external heating/cooling source 242 can be attached to the electronic device 222, as illustrated in FIG. 2. In another embodiment, the external heating/cooling source may be spaced apart but still adjacent to the electronic device 222. The position of the external heating/cooling source 242 should not the spaced so far away such that heating or cooling from the external heating/cooling source 242 would significantly interfere with the temperature of another electronic device (e.g., electronic device 224 or 226). In one embodiment, the external heating/cooling source 242 can provide heat to the electronic device 222, cool the electronic device 222, or any combination thereof. The external heating/cooling source 242 can include a heating element (e.g., a resistive wire), a burner, a fan, an evaporator of a refrigeration loop, other suitable heating or cooling element, or any combination thereof. Similar configurations can be used for the electronic device 224, a measuring device 234, and an external heating/cooling source 244, as well as the electronic device 226, a measuring device 236, and an external heating/cooling source 246.

FIG. 3 includes a flow diagram for a method of using the testing system 200 when collecting data regarding die temperatures and electrical data for a first set of electronic devices, wherein the collected data can be used as correlation data. Each of the electronic devices within the first set may belong to the same electronic device family, or in a particular embodiment, the electronic devices may be substantially identical to one another. Each of the electronic devices may be similar to electronic device 10, in that each of the electronic devices can include a die 12, a substrate 14, a case 16, and external connectors 18. The electronic devices can be mounted onto or otherwise attached to the testing board 210.

In one embodiment as illustrated in FIG. 3, the method can include testing the electronic devices, at block 302. The testing can reflect the same or different conditions that subsequently-tested electronic devices will experience during subsequent burn-in or other testing. The method can also include determining the current drawn, testing voltage for, or power consumed by each of the electronic devices during testing, at block 322. The testing voltage may be determined by measuring the voltage on terminals of an external power source, or by measuring the voltages on power supply connections of the electronic device, such as a difference between $V_{SS}$ and $V_{DD}$. The current can be determined by measuring the amount of current drawn by each electronic device. In one embodiment, the current can be the current passing through a $V_{SS}$ connection, a $V_{DD}$ connection, or other power supply connection of the electronic device. The measuring devices 232, 234, and 236 can be used in obtaining the measurements for the electronic devices 222, 224, and 226, respectively.

The method can further include measuring a die temperature for each of the electronic devices during testing, at block 324. In one embodiment a conventional or proprietary thermal diode or resistor can be used within the die to determine the die temperature. Before using the thermal diode or resistor to determine the die temperature, the readings using the thermal diode or resistor may be calibrated using readings of known temperatures. The calibration can be performed using a conventional or proprietary technique. In another embodiment, additional data, such as case temperatures, power or another signal provided to the external heating/cooling source, other suitable data, or any combination thereof may be collected and used as correlation data.

The method can still further include generating an equation or a table based at least in part on (1) the die temperatures and (2) the currents drawn by the electronic devices, testing voltages for the electronic devices, or powers consumed by the electronic devices, at block 342.

In one embodiment, the equation may be used. In a particular embodiment, a least-squares fit or other regression technique can be used to generate the equation. The equation can be subsequently used to estimate a die temperature that is a function of the current drawn by an electronic device, the testing voltage for the electronic device, or the power consumed by the electronic device. The equation may also be a function of the case temperature. Thus, in a subsequent test of another electronic device, a die temperature can be estimated using one or more readings from one or more measuring devices (e.g., the measuring device 232). In a particular embodiment, the thermal resistance of the case may be used in the equation, as such, or may be part of an overall coefficient for the equation.

In another embodiment, a table can be generated and stored within a database or other memory accessible to the temperature controller 250, the testing system controller 260, or both. Each tuple within the table can include (1) current drawn by a particular electronic device, testing voltage for the particular electronic device, power consumed by the particular electronic device, or a combination thereof at a point in time during testing, and (2) a corresponding die temperature taken at approximately the same time as the current drawn by the particular electronic device, testing voltage for the particular electronic device, power consumed by the particular electronic device, or combination thereof. The table may include other information, such as case temperatures, power or other signals to the external heating/cooling source, other suitable data, or any combination thereof. Different tables may be used for different types of cases used, different thermal resistivities, or the like. For example, one table can be for a die in a plastic case, and another table for substantially the same die in a ceramic case. After reading this specification, skilled artisans will appreciate that different cases have different thermal resistances and each case type may have its own table. More details regarding the equation and table are described in more detail later in this specification.

After the data have been collected for a sample of electronic devices, as described with respect to FIG. 3, the equation, table generated from such data, or any combination thereof can be used to estimate the die temperature without having to measure the actual die temperature when burning-in or otherwise testing subsequent electronic devices that belong to the same electronic device family.

FIGS. 4 and 5 include a process flow chart to illustrate an embodiment of the burn-in or other testing procedure that can be used in conjunction with the equation or table as described with respect to FIG. 3. The method can include connecting the electronic devices to a power source, at block 402 in FIG. 4. In one embodiment, many electronic devices may be burned-in or otherwise tested substantially simultaneously. Referring to FIG. 2, the electronic devices can include electronic device 222, 224, 226, and potentially other electronic devices (not illustrated) that may be mounted or otherwise attached to the testing board 210. In one embodiment, all of the electronic devices on the testing board 210 can belong to the same electronic device family, or in a particular embodiment, all of the electronic devices attached to the testing board 210 may be substantially identical to one another. The testing board 210 can be bi-directionally coupled to a testing system controller 260, which is bi-directionally coupled to the automatic temperature controller 250. Each of the electronic devices 222, 224, 226 are coupled to measuring devices 232, 234, and 236, respectively. The external heating/cooling sources 242, 244, and 246 are adjacent to the electronic devices 222, 224, and 226, respectively, and each of the external heating/cooling sources 242, 244, 246 are coupled to the automatic temperature controller 250. Although not illustrated, the other electronic devices may include similar measuring devices and external heating/cooling sources.

The method can also include initiating the automatic temperature control system for the electronic device, at block 404 in FIG. 4. The temperature controller 250 or testing system controller 260 in FIG. 2 or an operator may determine a target die temperature for the electronic devices 222, 224, 226, etc. The target die temperature may be used in order for the automatic temperature controller 250 to operate properly the external heating/cooling sources 242, 244, and 246. In addition, the initialization procedure can used to associate each of the electronic devices with its corresponding measuring device and its corresponding external heating/cooling source. After reading this specification, skilled artisans will appreciate that one or more other actions may be taken during the initialization procedure.

The method can further include allowing the temperature of the electronic devices to stabilize, at block 406 in FIG. 4. Before testing or otherwise operating the electronic devices, the case temperature may be taken to the target die temperature. After stabilization, the case and die temperatures can be substantially the same. In one embodiment, an external heating/cooling source may be used to adjust the temperature of the case until the case temperature is stabilized. In another embodiment, the ambient surrounding may be taken to the target die temperature before testing begins, and in still another embodiment, the ambient temperature may be taken to a temperature higher or lower than the target die temperature. In still another embodiment, the external heating/cooling sources can be used to take the case temperature to a predetermined temperature before burn-in or other testing begins. After reading this specification, skilled artisans will be able to determine pre-testing heating or cooling conditions before burn-in or other testing begins.

The method can also include testing the electronic devices, at block 422 in FIG. 4. The testing can include any one or more tests used during burn-in or other testing procedures to be used for the electronic devices 222, 224, and 226. Different types of testing have been described with respect to FIG. 3. Testing conditions used with the correlation data may be the same or different from the testing conditions for the subsequently-tested electronic devices.

The method can also include determining the currents drawn by the electronic devices, testing voltages for the electronic devices, or powers consumed by the electronic devices during testing, and block 502 in FIG. 5. The current, testing voltage, or power may be determined using at least in part the measuring device 232, 234, 236, etc. as previously described. In one embodiment, power may be used. In this particular embodiment, the different voltage for the power source terminals of the electronic devices may be maintained at a substantially constant value. Even with the substantially constant voltage, the amount of current drawn by each of the electronic device may be significantly different due to device-by-device variations, even if the electronic devices are substantially identical. For example, the width of the gate electrodes within the CPUs or for the word lines within a memory section of the electronic devices may vary by up to 10%, even when using the same mask set and fabrication equipment. The narrower widths may result in a relatively faster part that consumes more power, and the wider widths may result in a relatively slower part that consumes less power. The amount of current drawn by substantially identical parts can be different by a factor of up to four or potentially higher. For a particular electronic device, the voltage for the power supply terminals times the current, as measured by the corresponding measuring device, may be multiplied together to generate a power consumption value for that electronic device.

The method can further include estimating the die temperatures using the currents drawn by the electronic devices, testing voltages for the electronic devices, or powers consumed by the electronic devices, at block 522. The equation, table, or any combination thereof, as previously described with respect to the correlation data, can be used to estimate the die temperatures.

In one embodiment, the equation, as described with respect to FIG. 3, can be used such that the current drawn by a particular electronic device, testing voltage for the particular electronic device, or power consumed by the particular electronic device is input into the equation to estimate a die temperature. This estimated die temperature can be based at least in part on the data previously described with respect to FIG. 3. In another embodiment, the equation may also use the case temperature, power or another signal to the external heating/cooling source, other suitable data, or any combination thereof, as another input to equation. The thermal resistance of the case may be included in the equation as a coefficient or as part of an overall coefficient for the equation. The estimated die temperature can be determined by a processor within the temperature controller 250, the testing system controller 260, or within another processor (not illustrated) in testing system 200.

In another embodiment, a lookup table can be used such that the current drawn by the electronic device, testing voltage for the electronic device, or power consumed by the electronic device being tested is compared to the closest current, testing voltage, or power within the correlation data. The corresponding die temperature for that closest current, testing voltage, or power reading may be the estimated die temperature for the electronic device being tested. In a further embodiment, the estimated die temperature can be used based on a plurality of readings within the table. For example, two, three, or more closest readings to the reading for the electronic device under test may be used to calculate an estimated value. In a particular embodiment, the electronic device may consume a power of approximately 9 W during testing. The correlation data may have data points for 7 W and 10 W, and measured die temperatures of 117° C. and 129° C., respectively. By a using a ratio of the numbers, the estimated die temperature may be approximately 125° C. when the power is approximately 9 W. One or more other variables may be used, such as case temperature, power or signal to the external heating/cooling source, other suitable variable, or any combination thereof. The estimated temperature can be determined by the automatic temperature controller 250, the testing system controller 260, or another processor (not illustrated) coupled to the testing system 200.

The method can still further include adjusting one or more external heating cooling sources in response to estimating the die temperatures, at block 542 in FIG. 5. The temperature controller 250 in FIG. 2 can send appropriate signals to the external heating/cooling sources to heat or cool the electronic devices 222, 224, 226, etc. in response to the estimated die temperatures, as compared to the target die temperature. In one embodiment, after adjusting one or more of the external heating/cooling sources 242, 244 or 246, the case temperatures of the electronic devices 222, 224, and 226 may be the same or different from one another, even after being allowed sufficient time for the case temperature to stabilize (after adjusting the external heating/cooling source(s)).

A determination can be made whether testing is to continue, at diamond 562 in FIG. 5. In one embodiment, a series of different tests may be performed on any one or more sections of the electronic devices 222, 224, 226, etc. For example, in a microcontroller, one set of tests can be used for its CPU, and another set of tests may be used for a memory section within the microcontroller. After reading this specification, one of ordinary skill in the art will be capable of determining how they will test the electronic devices to meet the needs or desires of the business.

Different alternatives can be used with respect to the set of testing conditions and die temperatures. The data used to characterize the die temperature as a function of current, testing voltage, or power may use data from a single set of conditions, a combination of sets of conditions, or may have different sets of conditions for different sets of tests. In one embodiment, the electronic device can be a memory electronic device, such as a static random-access memory ("SRAM") integrated circuit. One or more tests may be performed on the SRAM integrated circuit. Because most of the SRAM integrated circuit includes an SRAM array, a single set of conditions may be used in generating correlation data for later use in estimating die temperature.

In one particular embodiment, the electronic device can include microcontroller that includes a CPU section and a memory section. The tests for the CPU may be different from the tests for the memory section. Still a single set of conditions may be used to estimate the die temperature. For example, die temperature and current, testing voltage, or power for the correlation data may be collected for just the CPU testing, memory testing, or both to form a single set of conditions. In subsequently-tested electronic devices (e.g., microcontrollers), the correlation data from the single set of conditions may be used to estimate die temperature regardless of the test being performed on the subsequently-tested electronic devices.

In still another particular embodiment, tests on different sections of the electronic device may have different estimated die temperatures for similar current, testing voltage, or power. For the microcontroller, a set of conditions can include collected die temperatures and current, testing voltage or power for CPU testing to generate a first set of correlation data, and another set of conditions can include collected die temperatures and current, testing voltage or power for memory testing of the same electronic device to generate a second set of correlation data. The first set of correlation data may be used during subsequent testing of the CPU section of the subsequently-tested microcontrollers, and the second set of correlation data may be used during subsequent testing of the memory section of those subsequently-tested microcontrollers.

In still a further embodiment, an electronic device may have different thermal diodes or resistors for different sections of the electronic device. In this manner, the die temperature may be tailored to the actual section being tested. Thus, when generating one or more sets of correlation data, a temperature sensor within or closer to the CPU section may be measured when the CPU section is being tested, and another temperature sensor within or closer to the memory section may be measured when the memory section is being tested. In one embodiment, the estimated die temperature for the section being tested may be closer to the target die temperature as compared to using a single temperature sensor when generating the correlation data. Such flexibility can become significant with larger die that have significantly diverse functions performed in separate sections of the die.

The methods and systems described herein can allow burn-in or other testing to be performed while still providing reasonable estimates of actual die temperatures. Correlation data including die temperatures and currents, testing voltages, or powers can be generated during burn-in or other testing of electronic devices that can be used during subsequent testing of other electronic devices that belong to the same electronic device family. The burn-in and testing of the subsequently-tested electronic devices can be performed using a die temperature that is estimated based on the correlation data. For the subsequently burned-in or tested electronic devices, readings from thermal diodes or resistors are not needed, and thus, simplify the testing system set up, testing procedures (as reading from the thermal diodes or resistors do not need to be taken, which could slow down or otherwise interfere with testing), or any combination thereof. The methods and systems described herein can be used to control the die temperature on a device-by-device basis.

Many different aspects and embodiments are possible. Some of those aspects and embodiments are described below. After reading this specification, skilled artisans will appreciate that those aspects and embodiments are only illustrative and do not limit the scope of the present invention.

In a first aspect, a method of testing a first electronic device can include testing the first electronic device using a first set of conditions, wherein the first electronic device includes a first die. The method can also include estimating a first die temperature for the first electronic device during testing using the first set of conditions, wherein the first die temperature is estimated at least in part using a current drawn by the first electronic device, a testing voltage for the first electronic device, or a power consumed by the first electronic device.

In one embodiment of the first aspect, the method can further include setting a target die temperature for the first electronic device and adjusting an external heating/cooling source in response to estimating the first die temperature. In a particular embodiment, the method can further include testing the first electronic device using a second set of conditions, and estimating a second die temperature for the first electronic device during testing using the second set of conditions, wherein the second die temperature is estimated at least in part using the current drawn by the first electronic device, the testing voltage for the first electronic device, or the power consumed by the first electronic device. In a more particular embodiment, the method can further include adjusting an external heating/cooling source in response to estimating the second die temperature.

In another embodiment of the first aspect, the method can further include testing second electronic devices using the first set of conditions, wherein each of the second electronic devices includes a second die and is substantially identical to the first electronic device. The method can also include measuring second die temperatures for the second electronic devices during testing using the first set of conditions. In a particular embodiment, the method can further include determining the current drawn by each of the second electronic devices, the testing voltage for each of the second electronic devices, or the power consumed by each of the second electronic devices during testing the second electronic device. In a more particular embodiment, the method can further include generating an equation, wherein an estimated die temperature is a function of the currents drawn by the second electronic devices, the testing voltages for the second electronic devices, or the powers consumed by the second electronic devices, and wherein estimating the first die temperature can be performed using the equation. In another more particular embodiment, the method can further include generating a table that includes (1) second die temperatures and (2) the currents drawn by the second electronic devices, the testing voltages for the second electronic devices, or the powers consumed by the second electronic devices, wherein estimating the first die temperature is performed using the table.

In still another embodiment of the first aspect, estimating the first die temperature is performed such that the first die temperature is estimated at least in part using a case temperature of the first electronic device. In yet another embodiment, estimating the first die temperature is performed such that the first die temperature is estimated at least in part using a power or another signal to an external heating/cooling source thermally coupled to the first electronic device.

In a further embodiment of the first aspect, the method can further include testing a second electronic device using the first set of conditions, wherein the second electronic device includes a second die, and the second electronic device belongs to a same electronic device family as the first electronic device. The method can also include estimating a second die temperature for the second electronic device during testing using the first set of conditions, wherein the second die temperature is estimated at least in part using the current drawn by the second electronic device, the testing voltage of the second electronic device, or the power consumed by the second electronic device. In a particular embodiment, testing the first electronic device using the first set of conditions and testing the second electronic device using the first set of conditions are performed substantially simultaneously during at least one point in time. In a more particular embodiment, the method can further include setting a target die temperature for the first electronic device and the second electronic device. In an even more particular embodiment, the method can further include adjusting a first external heating/cooling source adjacent to the first electronic device in response to estimating the first die temperature and adjusting a second external heating/cooling source adjacent to the second electronic device in response to estimating the second die temperature. In still an even more particular embodiment, the first electronic device includes a first case having a first case temperature, the second electronic device includes a second case having a second case temperature, and after adjusting the first external heating/cooling source and adjusting the second external heating/cooling source, the first case temperature is different from the second case temperature. In yet another particular embodiment, the second electronic device is substantially identical to the first electronic device.

In a second aspect, a method of testing electronic devices can include testing first electronic devices using a first set of conditions, wherein each of the first electronic devices includes a first die. The method can also include determining a current drawn by each of the first electronic devices, a testing voltage for each of the first electronic devices, or a power consumed by each of the first electronic devices during testing the first electronic devices. The method can further include measuring a first die temperature for each of the first electronic devices during testing using the first set of conditions, and generating a first equation or a first table based at least in part on (1) the first die temperatures and (2) the currents drawn by the first electronic devices, the testing voltages for the first electronic devices, or the powers consumed by the first electronic devices. The method can still further include setting a target die temperature for a second electronic device and a third electronic device, wherein the second electronic device includes a second die and the third electronic device includes a third die, and each of the first, second, and third electronic devices are substantially identical to one another. The method can yet further include testing the second electronic device and the third electronic device using the first set of conditions, and estimating a second die temperature for the second electronic device during testing using the first set of conditions, wherein the second die temperature is estimated at least in part using the first equation, the first table, or any combination thereof. The method can also include adjusting a first external heating/cooling source adjacent to the second electronic device in response to estimating the second die temperature. The method can further include estimating a third die temperature for the third electronic device during testing using the first set of conditions, wherein the third die temperature is estimated at least in part using the first equation, the first table, or any combination thereof, and adjusting a second external heating/cooling source adjacent to the third electronic device in response to estimating the third die temperature.

In one embodiment of the second aspect, generating the first equation or the first table can includes generating the first equation, wherein an estimated die temperature is at least a function of the currents drawn by the first electronic devices, the testing voltages for the first electronic devices, or the powers consumed by the first electronic devices, or generating the first table that includes (1) the first die temperatures and (2) the currents drawn by the first electronic devices, the testing voltages for the first electronic devices, or the powers consumed by the first electronic devices.

In another embodiment of the second aspect, the method can further include testing fourth electronic devices using a second set of conditions, wherein each of the fourth electronic devices includes a fourth die, and the second, third, and fourth electronic are substantially identical to one another. The method can also include determining the current drawn by each of the fourth electronic devices, the testing voltage for each of the fourth electronic devices, or the power consumed by each of the fourth electronic devices during testing the fourth electronic devices, and measuring a fourth die temperature for each of the fourth electronic devices during testing using the second set of conditions. The method can further include generating a second equation or a second table based at least in part on (1) the fourth die temperatures and (2) the currents, the testing voltages, or the powers for the fourth electronic devices. The method can still further include testing the second electronic device and the third electronic device using the second set of conditions, wherein testing the second electronic device and the third electronic device are performed at substantially a same time. The method can yet further include estimating a fifth die temperature for the second electronic device during testing using the second set of conditions, wherein the fifth die temperature is estimated at least in part using the second equation, the second table, or any combination thereof, and adjusting the first external heating/cooling source in response to estimating the fifth die temperature. The method can also include estimating a sixth die temperature for the third electronic device during testing using the second set of conditions, wherein the sixth die temperature is estimated at least in part using the second equation, the second table, or any combination thereof, and adjusting the second external heating/cooling source in response to estimating the sixth die temperature.

In a particular embodiment of the second aspect, the second electronic device can include a first case having a first case temperature, and the third electronic device can include a second case having a second case temperature. After adjusting the first external heating/cooling source and adjusting the second external heating/cooling source, the first case temperature may be different from the second case temperature.

EXAMPLE

The flexibility of the method and system can be further understood in the non-limiting example described herein. The embodiments as further described in the following example are meant to illustrate potential uses and implementations and do not limit the scope of the invention. This example demonstrates that the ability to estimate the die temperature on a device-by-device basis can improve burn-in conditions to be more consistent between electronic devices due to a smaller the spread of actual die temperatures.

Two sets each including approximately 80 substantially identical electronic devices can be fabricated using any one or more conventional proprietary processes. One set of electronic devices can be burned-in using a fixed case temperature scenario, as conventionally used. The other set of the electronic devices will be burned-in using estimated die temperatures using any one or more of the methods as described herein.

Figure 6:
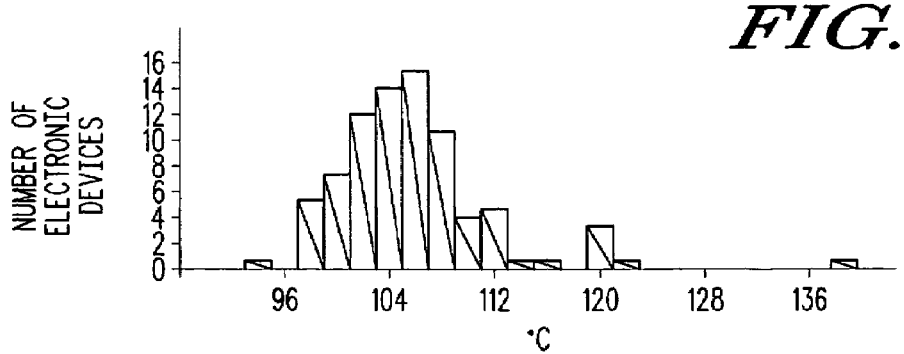
FIG. 6 includes a plot illustrating a die temperature distribution when using a constant case temperature.

FIG. 6 includes an illustration of the distribution of estimated die temperatures (° C.) for a fixed case temperature of approximately 90° C. The distribution of electronic devices in FIG. 6 includes one or more electronic devices, wherein the minimum die temperature is 93° C., the maximum die temperature is 138° C., the mean temperature of 106° C., and the median temperature of 105° C. The standard deviation of estimated die temperature is 6° C.

Figure 7:
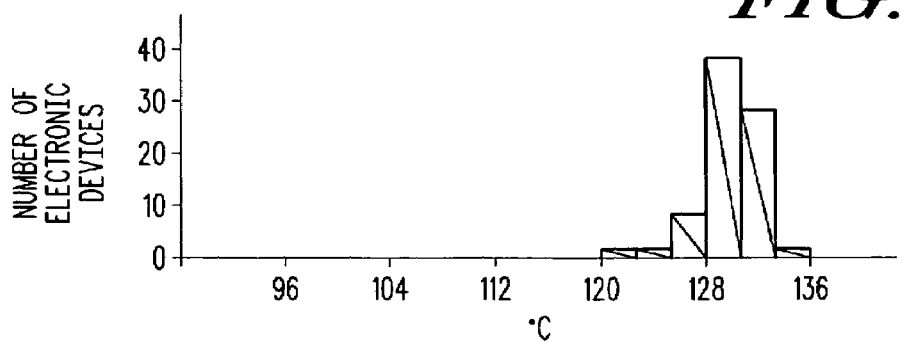
FIG. 7 includes a plot illustrating a die temperature distribution when a current, testing voltage, or power is used to estimate die temperature.

FIG. 7 includes an illustration of the distribution of estimated die temperatures (° C.) the estimated junction temperatures using one or more of the methods as described herein. The distribution of electronic devices in FIG. 7 includes one or more electronic devices, wherein the minimum die temperature is 122° C., the maximum die temperature is 135° C., the mean temperature is 130° C., and the median temperature is approximately 130° C. The standard deviation is 2° C. Thus, the methods and systems as described herein can be used to achieve a tighter and better controlled die temperature distribution by monitoring the current, testing voltage, or power of the electronic devices instead of only using the case temperature. The estimated die temperature can be used as at least part of the basis to adjust the heating and cooling of the electronic device. Further improvements with reducing thermal interface resistance may allow the distribution as illustrated in FIG. 7 to be further narrowed.

Note that not all of the activities described above in the general description or the examples are required, that a portion of a specific activity may not be required, and that one or more further activities may be performed in addition to those described. Still further, the order in which activities are listed is not necessarily the order in which they are performed.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that a structural substitution, logical substitution, or another change may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. §1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed subject matter requires more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of testing comprising:
    testing a first electronic device using a first set of conditions, wherein the first electronic device comprises a first die and a first temperature sensor;
    determining first currents drawn by the first electronic device through a power supply connection of the first electronic device during testing the first electronic device using the first set of conditions;
    measuring first die temperatures for the first electronic device during testing the first electronic device using the first set of conditions, wherein measuring is performed using the first temperature sensor;

generating first temperature-current data in a form of a first equation or a first table based at least in part on the first die temperatures and the first currents drawn by the first electronic device;

testing a second electronic device using the first set of conditions, wherein the second electronic device comprises a second die and a second temperature sensor;

determining a second current drawn by the second electronic device through a power supply connection of the second device during testing the second electronic device;

estimating a second die temperature for the second electronic device during testing using the first set of conditions, wherein estimating is performed using the second current in conjunction with the first equation, the first table, or any combination thereof.

2. The method of claim 1, further comprising:
setting a target die temperature for the first electronic device; and adjusting an external heating/cooling source in response to estimating the second die temperature.

3. The method of claim 2, further comprising:
testing the first electronic device using a second set of conditions, wherein the second set of conditions are targeted for a particular part of the first electronic device, and the first set of conditions are targeted for a different particular part of the first electronic device, and the second set of conditions are different from the first set of conditions;

determining third currents drawn by the first electronic device through the power supply connection of the first electronic device during testing the first electronic device using the second set of conditions;

measuring third die temperatures for the first electronic device during testing the first electronic device using the second set of conditions, wherein measuring is performed using a third temperature sensor within the first electronic device that is different from the first temperature sensor;

generating second temperature-current data in a form of a second equation or a second table based at least in part on the third die temperatures and the third currents drawn by the first electronic device, wherein the second temperature-current data is different from the first temperature-current data;

testing a second electronic device using the second set of conditions;

determining a fourth current drawn by the second electronic device through the power supply connection of the second electronic device during testing the second electronic device using the second set of conditions; and estimating a fourth die temperature for the second electronic device during testing the second electronic device using the second set of conditions, wherein estimating is performed using the fourth current in conjunction with the second equation, the second table, or an combination thereof.

4. The method of claim 3, further comprising adjusting the external heating/cooling source in response to estimating the fourth die temperature.

5. The method of claim 1, wherein estimating the second die temperature is performed without using the second temperature sensor.

6. The method of claim 1, wherein generating first temperature-current data comprises generating the first equation, wherein an estimated die temperature is a function of the first currents passing through a power supply connection of the first electronic device, wherein estimating the second die temperature is performed using the first equation.

7. The method of claim 1, wherein generating first temperature-current data comprises generating the first table that comprises first die temperatures and the first currents passing through a power supply connection of the first electronic device, wherein estimating the second die temperature is performed using the first table.

8. The method of claim 1, wherein:
the second electronic device includes a case; and
estimating the second die temperature is performed such that the second die temperature is estimated at least in part using a case temperature of the second electronic device.

9. The method of claim 1, wherein estimating the second die temperature is performed such that the second die temperature is estimated at least in part using a power or another signal to an external heating/cooling source thermally coupled to the second electronic device.

10. The method of claim 1, wherein testing the first electronic device using the first set of conditions and testing the second electronic device using the first set of conditions are performed substantially simultaneously during at least one point in time.

11. The method of claim 10, further comprising selling a target die temperature for the first electronic device and the second electronic device.

12. The method of claim 11, further comprising:
adjusting a first external heating/cooling source adjacent to the first electronic device in response to measuring the first die temperatures; and
adjusting a second external heating/cooling source adjacent to the second electronic device in response to estimating the second die temperature.

13. The method of claim 12, wherein:
the first electronic device comprises a first case having a first case temperature;
the second electronic device comprises a second case having a second case temperature; and
after adjusting the first external heating/cooling source and adjusting the second external heating/cooling source, the first case temperature is different from the second case temperature.

14. The method of claim 1, wherein the second electronic device is substantially identical to the first electronic device.

15. A method of testing electronic devices comprising:
testing first electronic devices using a first set of conditions, wherein each of the first electronic devices comprises a first die and a first temperature sensor;

determining currents drawn by each of the first electronic devices during testing the first electronic devices;

measuring a first die temperature for each of the first electronic devices during testing using the first set of conditions;

generating temperature-current data in a form of a first equation or a first table based at least in part on the first die temperatures and the currents drawn by the first electronic devices;

setting a target die temperature for a second electronic device and a third electronic device, wherein:
the second electronic device comprises a second die and a second temperature sensor, and the third electronic device comprises a third die and a third temperature sensor; and
each of the first, second, and third electronic devices are different electronic devices that are substantially identical to one another;

testing the second electronic device and the third electronic device using the first set of conditions;

estimating a second die temperature for the second electronic device during testing using the first set of conditions, wherein estimating the second die temperature is performed using the first equation, the first table, or any combination thereof, and without using the second temperature sensor;

adjusting a first external heating/cooling source adjacent to the second electronic device in response to estimating the second die temperature;

estimating a third die temperature for the third electronic device during testing using the first set of conditions, wherein estimating the third die temperature is performed using the first equation, the first table, or any combination thereof, and without using the third temperature sensor; and adjusting a second external heating/cooling source adjacent to the third electronic device in response to estimating the third die temperature.

16. The method of claim 15, wherein generating the temperature-current data comprises:

generating the first equation, wherein an estimated die temperature is at least a function of the currents drawn by the first electronic devices; or generating the first table that comprises the first die temperatures and the currents drawn by the first electronic devices.

17. The method of claim 15, further comprising:

testing fourth electronic devices using a second set of conditions, wherein:

each of the fourth electronic devices comprises a fourth die; and the second, third, and fourth electronic devices are substantially identical to one another;

determining currents drawn by each of the fourth electronic devices during testing the fourth electronic devices;

measuring a fourth die temperature for each of the fourth electronic devices during testing using the second set of conditions;

generating a second equation or a second table based at least in part on the fourth die temperatures and the currents drawn by the fourth electronic devices;

testing the second electronic device and the third electronic device using the second set of conditions, wherein testing the second electronic device and the third electronic device are per-formed at substantially a same time;

estimating a fifth die temperature for the second electronic device during testing using the second set of conditions, wherein the fifth die temperature is estimated at least in part using the second equation, the second table, or any combination thereof;

adjusting the first external heating/cooling source in response to estimating the fifth die temperature;

estimating a sixth die temperature for the third electronic device during testing using the second set of conditions, wherein the sixth die temperature is estimated at least in part using the second equation, the second table, or any combination thereof; and adjusting the second external heating/cooling source in response to estimating the sixth die temperature.

18. The method of claim 17, wherein:

the second electronic device comprises a first case having a first case temperature;

the third electronic device comprises a second case having a second case temperature; and after adjusting the first external heating/cooling source and adjusting the second external heating/cooling source, the first case temperature is different from the second case temperature.

* * * * *